United States Patent [19]
Grasset

[11] Patent Number: 5,311,144
[45] Date of Patent: May 10, 1994

[54] ULTRA-FAST DIFFERENTIAL AMPLIFIER

[75] Inventor: Jean-Charles Grasset, Fontaine, France

[73] Assignee: Thomson Composants Militaires et Spatiaux, Courbevoie, France

[21] Appl. No.: 979,267

[22] Filed: Nov. 20, 1992

[30] Foreign Application Priority Data

Nov. 22, 1991 [FR] France ............... 91 14406

[51] Int. Cl.$^5$ .............................................. H03F 3/45
[52] U.S. Cl. ...................... 330/252; 330/257
[58] Field of Search ............... 330/260, 257, 252, 261

[56] References Cited

U.S. PATENT DOCUMENTS 5,166,637  11/1992  Wurcer .......................... 330/257

FOREIGN PATENT DOCUMENTS 0264160  4/1988  European Pat. Off. .
5535516  3/1980  Japan .
9012454  10/1990  World Int. Prop. O. .

OTHER PUBLICATIONS

Patent Abstracts of Japan, vol. 5, No. 70, (E-56)(742), May 12, 1981, & JP-A-56 020315, "Low-Frequency Amplifying Circuit".

IEEE Journal of Solid-State Circuits, vol. SC-16, No. 6, Dec. 1981, pp. 626-633, D. R. Collins, et al., "An Open Loop Programmable Amplifier With Extended Frequency Range".

Primary Examiner—Steven Mottola
Assistant Examiner—J. Dudek
Attorney, Agent, or Firm—Oblon, Spivak, McClelland, Maier & Neustadt

[57] ABSTRACT

In a high gain differential amplifier, in order to obtain a high gain-band product, this amplifier is provided with a controlled feedback in current. In each of the channels of the amplifier, a current generator connected to the output of the amplifier draws a current through the load resistor of the channel. Each generator is constituted by a current mirror. Application to fast analog circuits.

8 Claims, 3 Drawing Sheets

ULTRA-FAST DIFFERENTIAL AMPLIFIER

BACKGROUND OF THE INVENTION

1. Field of the Invention

The present invention relates to an ultra-fast amplifier that is made with bipolar transistors and has good dynamic characteristics. These characteristics are obtained by means of a controlled positive feedback in current.

There are known ways, at present, of making operational amplifiers having very high gains of up to 100 million in low-frequency open-loop configurations, these gains being associated with very low offset voltages of some microvolts or some tens of microvolts.

These valuable characteristics are obtained at the cost of the dynamic performance characteristics: the gain-band product or transition frequency $F_T$ does not exceed some tens of megahertz and the slew-rate remains instrinsically limited to some tens of volts per microsecond except with highly sophisticated (and hence costly) technologies.

This deterioration of the dynamic performance characteristics results from the presence in the amplifier of a compensation capacitance C which determines the stability by creating a dominant pole that reduces the transition frequency and by limiting the slew-rate to I/C, I being the biasing current for the input stage.

The amplification of fast signals with restitution of the DC component needed in certain signal processing applications such as those related to video amplifiers, pulse amplifiers, fast sample-and-hold units etc. therefore cannot be resolved by this type of component.

In these applications, it is necessary, on the contrary, to have amplifiers with very wide passband (of some 100 MHz) and very high slew-rate (some 100 V/μs) to amplify the fast signals without distortion. The precision required in DC mode is generally less stringent (1/100 or 1/1000) and a voltage offset of some millivolts is generally tolerated.

2. Description of the Prior Art

The prior art approaches to solving these difficulties fall into three categories. In the first category, the structures derived from the conventional techniques of operational amplifiers are based on dielectrical insulation technologies. These approaches do not allow for achieving the highest slew-rates.

The second category relates to structures based on the techniques of non-looped wideband amplifiers. The absence of any overall feedback eliminates the compensation capacitances. These amplifiers which are not subjected to feedback are intrinsically the fastest ones, those that make it possible to approach the limits of speed possible according to the technology. However, the restitution of the DC component is very difficult to obtain for it is based on a technique of compensation for the DC offsets provided by the successive stages This method, which is still an approximate one, is greatly subject to temperature drifts and does not give satisfactory results, notably because of the increase in the number of components that have be introduced in order to return to the DC level.

The third category comprises the amplifiers for which the high gain is obtained by a positive feedback in voltage. The output signal is available only under high impedance. This makes the circuit sensitive, in stability, to the capacitive loads. Furthermore, these circuits have a smaller natural phase margin. This necessitates a slight compensation, hence a smaller passband and a reduced slew-rate, and makes it difficult in certain cases to achieve looping in follower mode.

SUMMARY OF THE INVENTION

The invention provides a different approach, which enables a differential amplifier to have, at the same time, a high gain, a high cut-off frequency and a high slew-rate. According to the invention, to a standard differential amplifier with resistive loads, there is added a current feedback (or positive current feedback) circuit, for which the loop gain, smaller than unity, is controlled so as to ensure the stability of the entire unit. The load resistors are connected between a supply pole and the outputs of the differential amplifier but they are also mounted in parallel with two current sources which apply their current feedback to the outputs More specifically, the invention relates to an ultra-fast high-gain differential amplifier constituted by two parallel channels, each formed by at least one semiconductor device and a single load resistor wherein, in order to give the amplifier a high gain-band product, it is provided with a controlled positive feedback in current constituted, for each channel, by a current generator which draws a current through the load resistor of the channel, in phase with the current coming from the semiconductor device to which the resistor is connected, each generator being connected between, on the one hand, a voltage source and, on the other hand, the point common to the semiconductor device and to the corresponding load resistor.

BRIEF DESCRIPTION OF THE DRAWINGS

The invention shall be understood more clearly from a more detailed description of an exemplary embodiment, this description being made with reference to the appended figures, of which.

DETAILED DESCRIPTION OF THE INVENTION

Figure 1:
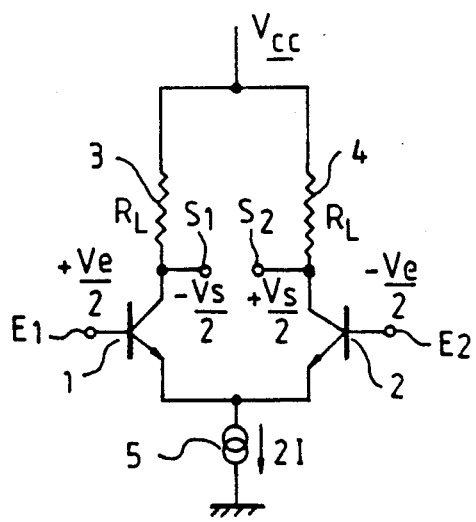
FIG. 1 shows an electrical diagram of a differential amplifier according to the prior art.

FIG. 1 shows a simplified diagram of a differential amplifier, and is aimed at facilitating the comparison with an amplifier according to the invention. In its simplest expression, a differential amplifier comprises two transistors 1 and 2, the bases of which are used as input terminals. The output terminals are taken at the collectors of these transistors which are charged by two load resistors 3 and 4, connected to a first pole $V_{cc}$ of a supply. The emitters of the transistors 1 and 2 are connected to the second pole of this supply, through a current source 5 which delivers a current 2I.

If $v_e$ designates the input voltage and $v_s$ designates the output voltage of an amplifier, in the event that this amplifier is of the differential type, it is usual to assign its two inputs a voltage $+v_e/2$ and its two outputs a voltage $v_s/2$.

The load resistors 3 and 4 have a value $R_1$ and the dynamic gain of this amplifier is:

$$G = v_s/v_e \approx_L I/U_t$$

where $U_t = kT/q = mV$ at 300° K ($k$ = Boltzmann's constant, T = temperature, q = charge of the electron).

Figure 2:
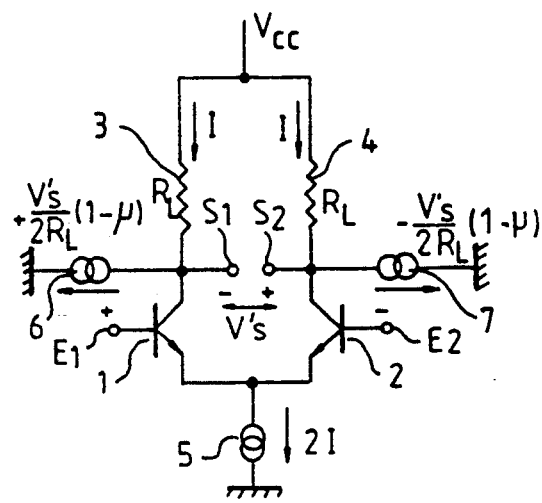
FIG. 2 shows a simplified diagram of a differential amplifier according to the invention.

In FIG. 2, which shows the basis of an amplifier according to the invention, it can be seen that the structure of the initial amplifier is unchanged, but that to each of the outputs there is added a current generator 6 or 7 which draws a current $+v'_S(1-\mu)/2R_L$ through each of the load resistors 3 and 4, $\mu$ being the copying error, with $\mu \ll 1$. Thus, the feedback is obtained by the application, to each of the resistors, of a controlled additional current in phase with the current coming from the transistor of the input pair to which the resistor is connected. On each arm of the differential amplifier, the current generator 6 or 7 and the collector of the transistor 1 or 2 are connected to a first terminal of the single load resistor 3 or 4, a second terminal of which is connected to the first supply pole $V_{cc}$. To simplify the explanation, it will be assumed that the transistor 1 constitutes the positive input: the generator 6 draws a positive current in phase with the one coming from the transistor 1. And, symmetrically, the generator 7 draws a negative current, in phase with the one coming from the transistor 2.

The copying error $\mu$ makes it possible to control the multiplier factor given by this feedback with respect to the standard gain G:

$$G' = v'_s/v \approx R_L I/\mu U_t$$

giving $$G' = G/\mu$$

An approach may be considered wherein, as a first approximation, a simulation is made of a fictitious load $R_L/\mu$ or a fictitious transconductance $g'm = gm/\mu$ $gm = I/U_t$.

Figure 3:
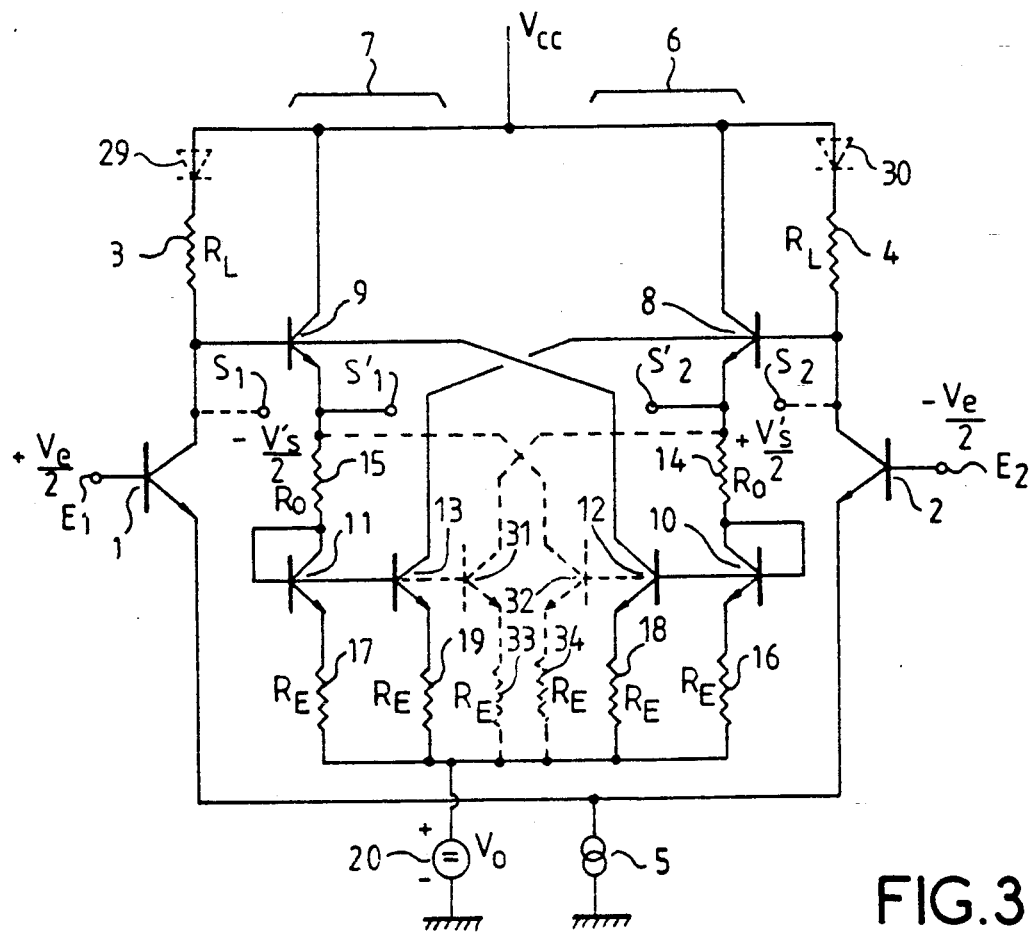
FIG. 3 shows a detailed diagram of the amplifier of the previous figure.

FIG. 3 shows a more detailed electrical diagram of this amplifier with controlled positive feedback in current The transistors are all of the NPN type. However, this figure does not show the output stages, which are outside the scope of the invention.

The skeleton of the differential amplifier is constituted by the transistors 1 and 2 and the resistors 3 and 4, as well as the current generator 5, as here above.

The feedback current generator 6 is constituted by a current mirror formed by the transistors 10 and 12 and the transistor 8 which works as a voltage follower.

The transistor 8 has its base connected to the common point between the load resistor 4 and the collector of the transistor 2, namely to the output $S_2$ of the amplifier.

A resistor 14 with a value $R_o$ is connected between the emitter of the transistor 8 and the collector of the transistor 10. Similarly, two resistors 16 and 18, with a value $R_E$, are connected between the emitters of the transistors 10 and 12 and a voltage source 20 which shall be referred to hereinafter. These resistors 16 and 18 are degeneration resistors to reduce the noise factor of the amplifier, and are chosen such that:

$$R_o = R_E = R_L$$

It is known that a current mirror may have two different supply sources for its two arms. The first arm of this mirror (transistors 8 and 10) is supplied from the source $V_{cc}$ common to the differential amplifier. The second arm (transistor 12) is supplied from the point common to the load resistor 3 and to the collector of the input transistor 1. This amounts to saying that the second arm of the generator 6 is connected to the output $S_1$ of the differential amplifier.

Consequently, the follower transistor 8 follows the voltage on the output $S_2$ of the amplifier, generating proportional current variations in $R_o$ which are copied by the mirror 10+12 at $S_1$: the generator 6 draws a current through the load resistor 3, and it acts quite like a current generator which exerts a controlled positive feedback in current.

The same reasoning applies to the generator 7, after transposition to the transistors 9, 11 and 13 and to the resistors 15, 17 and 19, for the second arm of the differential amplifier.

It must be noted that, in FIG. 3, the differential amplifier comprises four outputs. The outputs $S_1$ and SFR, on the collectors of the input transistors 1 and 2, are the "normal" outputs of an amplifier, but it is preferable to choose the outputs $S'_1$ and $S'_2$ on the emitters of the transistors 8 and 9 of the feedback amplifier, for these transistors serve as natural impedance adaptors of the assembly without contributing any additional phase-shift.

The set of the two generators 6 and 7 constitutes a transconductance amplifier controlled by the differential voltage $S_1 - S_2$ which flows through the opposite loads 3 and 4.

The value of the transconductance in first-order terms is:

$$1/(R_o + R_E + 2 r_{eo}) = 1/(R_L + 2r_{eo})$$

The voltage gain of this feedback obtained by delivery into the loads $R_L$ is equal to:

$$R_L(R_L + 2r_{eo}) = 1 - 2r_{eo}/R_L$$

of the form $(1-\mu)$ with $\mu = 2r_{eo}/R_L \ll 1$ $r_{eo}$ with $U_t/I$ for the transistors 10 and 8.

The multiplier factor of amplification $1/\mu$ is thus defined by being controlled.

The voltage Vo generator 20 gives a possible additional degree of freedom in the choice of the dynamic and static parameters. It is possible to take Vo=0.

Since the value of the multiplier factor $1/\mu$ depends, in first-order terms, on the ratio $\mu = 2r_{eo}/R_L$, where $r_{eo}$ represents the dynamic impedance of the emitter of the transistors 8 and 10 (9 and 11), it may be useful to multiply it by 2 in two different ways:

either through the insertion, according to an ancillary method, of a diode 29 (30) in series with the load 3 (4) provided that, through $V_o$, quiescent or zero-signal currents are chosen in 8 and 9 equal to those of 1 and 2, namely I.

or by cancelling one of the two dynamic impedances $r_{eo}$ constituting $\mu = 2r_{eo}/R_L$, in this case the impedances of 8 and 9.

This is obtained by the addition of a supplementary output to each mirror, by means of the transistors 31 and 32, and their associated degeneration resistors 33, 34, the output of 31 (32) being connected to the emitter of 8 (9).

Since the currents that flow in 32 and 9 (31 an 8) are in phase opposition and have the same amplitude in first-order terms, this method is used to cancel the dynamic impedance 20 of the transistors.

Besides, in certain special cases, it may be useful to replace the elementary mirror used in the feedback circuit (10, 12 and 11, 13) by a more elaborate mirror structure such as a "buffered" mirror or Wilson mirror known in the prior art.

The approach shown in FIGS. 2 and 3 does not entail any assumptions about the nature of the input transducer device.

Figure 4:
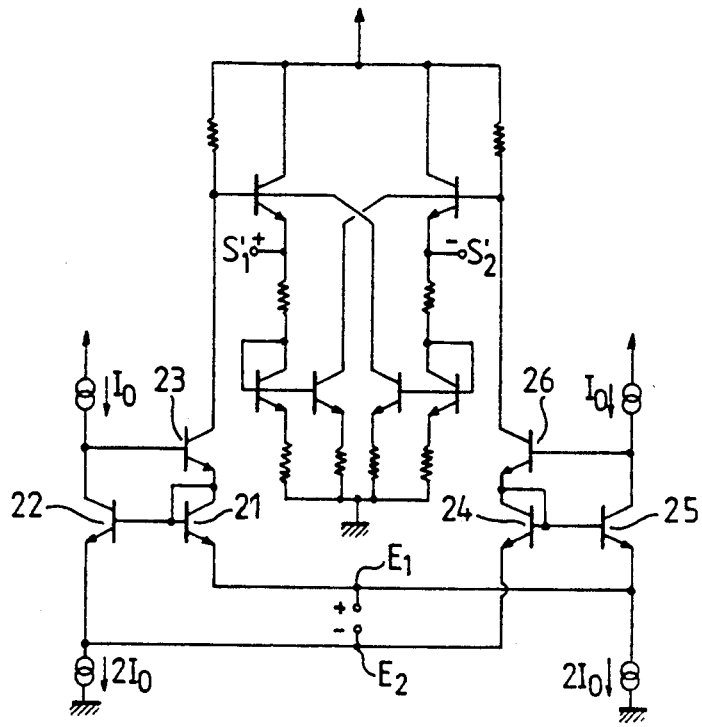
FIG. 4 shows a variant of the amplifier of FIG. 3.

It is also possible to envisage an input transducer built around two mirrors to which signals are supplied by the emitters and not, any longer, by the bases, as shown in FIG. 4. This approach gives the assembly the structure of a transimpedance amplifier in view of its low input impedance.

This approach has been implemented in the derived "transimpedance" assembly by using simple mirrors or Wilson type mirrors that provide for the cascoding of the input transistors, 21 and 25 for the input $E_1$ and 22 and 24 for the input $E_2$ of FIG. 4.

An open-loop gain of 75 dB is obtained. The corollary of this improvement obtained by making the structure more complex lies in the lower quality of the frequency response. A second pole appearing in the band makes it necessary to have a slight compensation reducing the useful maximum band, in follower operation, to a value below one gigahertz.

The differential amplifiers according to the invention are remarkable in their simplicity of structure, which gives them their performance characteristics.

The gain of these amplifiers is achieved in only one stage with a dominant pole located on the differential output S1-S2. Apart from the pole of an additional output follower, the phase shift of which can be overlooked initially, there is no second stage that provides any significant phase rotation which would make it necessary to set up a dominant pole between S1 and S2.

Figure 5:
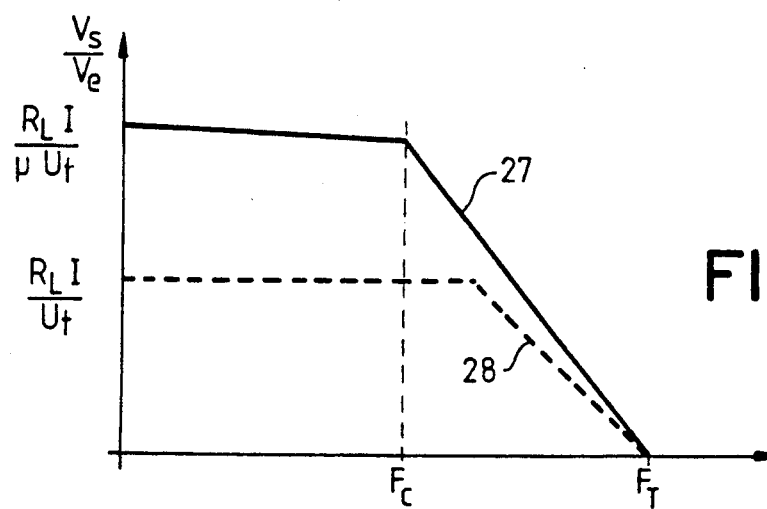
FIGS. 5 to 9 show dynamic characteristic curves obtained with the amplifier according to the invention.

The frequency response of the stage is excellent and little different from the frequency response of the standard differential stage with resistive loads. Only the low frequency gain is increased. In practice, it is possible to obtain transition frequencies (0 dB, phase margin 35° to 45°) close to Ft/2 where Ft is the transition frequency of the transistors, as can be seen in FIG. 5 which shows the frequency response F as a function of the open loop gain, for an amplifier according to the invention (27) compared with a standard differential amplifier (28).

This overall response quality comes from the response quality of the feedback amplifier, the low gain $(1-\mu)$ of which is accompanied by a high gain-band product and a modest phase shift. An advantage retained is that of the high transition frequency of the standard resistive load assembly, which is the fastest linear amplifier known, and the fundamental characteristic of the operational amplifiers is added to it: a great DC gain of 60 to 70 dB.

The modest phase rotation that accompanies the drop in loop gain towards 0 dB calls for no compensation capacitance or very little compensation capacitance between the nodes S1 and S2. Since this type of stage is biased at relatively high currents of some hundreds of $\mu A$, in comparison with those conventionally observed at the input stages of operational amplifiers, the result thereof is extremely high slew-rates, since this high current has to charge or discharge practically only parasitic capacitances.

With regard to the noise, the absence of any true active load in the assembly makes it possible again to obtain spectral densities of thermal noise close to those obtained in low gain, wideband amplifiers, of UHF applications of the order of several $nV/\sqrt{Hz}$. The very remarkable characteristic is the flatness of the spectral density of noise up to the transition frequency of the amplifier.

Finally, it must be noted that the output of the amplifier according to the invention is intrinsically differential, by structure, which gives it a major advantage from the viewpoint of the quality of the processing of the signal, especially in view of the very wide passband that it offers. The rate of rejection of the supplies in the processing of the overall signal is thereby improved. Finally, it must be noted that the fact of working in differential mode gives a increase of 6 dB in the loop gain as compared with a simple output and almost one octave in the transition frequency measured at 0 dB.

Figure 6:
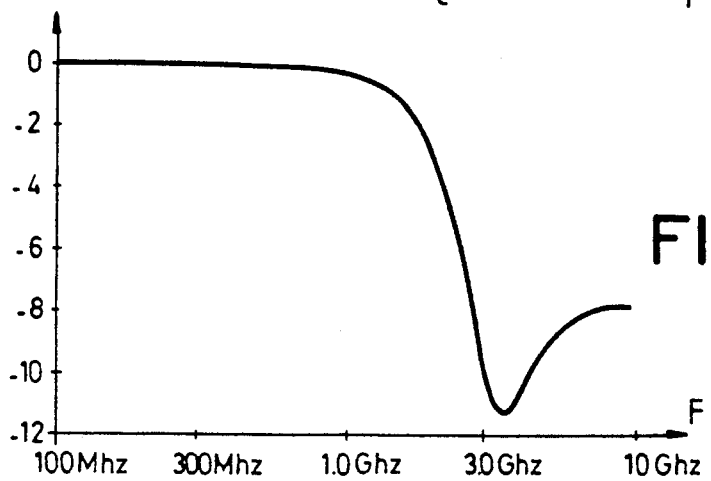

The following figures give the performance characteristics of circuits based on a fast technology:

$F_T$ of the transistors = 8 GHz
Early voltage = 33 volts
load resistance $R_L$ = 16 K Ohms
Bias current $2 \times 250 \mu$ amperes FIG. 6 shows the frequency response (attenuation on the y-axis) of the amplifier according to the invention, looped in follower mode. In a differential output assembly, a gain-band product of 4.5 GHz is obtained, with a natural phase margin, without compensation, of 40°.

Another advantage, from the viewpoint of the frequency response, is the possibility of exploiting the output signal at relatively low impedance. Indeed, the output signals are naturally buffered by the followers of the feedback amplifier (8+9) and therefore come out at an impedance that is diminished by the gain of the transistors.

The usefulness is obvious from the viewpoint of the response on capacitive load which, after the addition of output followers, makes it possible to keep a gain-band product of 2.4 GHz (phase margin of 45°) on a capacitive load of 10 pF.

Figure 7:
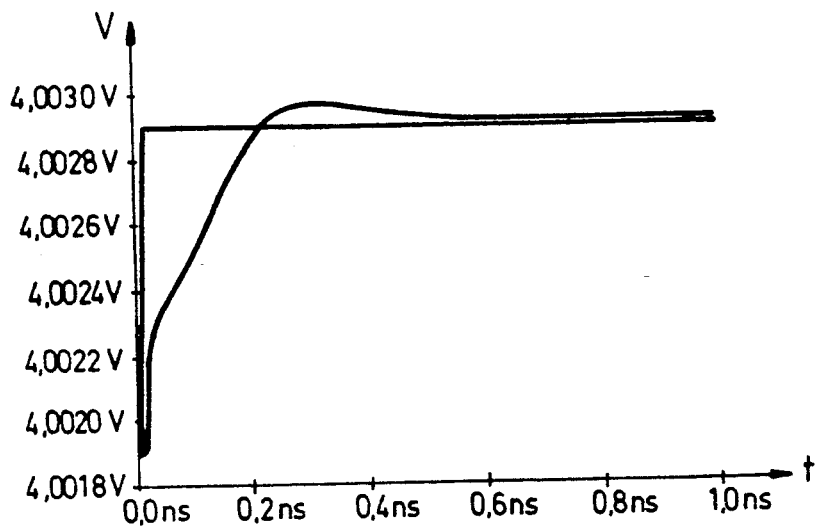

For the same amplifier, FIG. 7 gives the pulse response: for a pulse of 1 mV, a response time $t_r < 200$ psec is obtained, in accordance with the passband.

Figure 8:
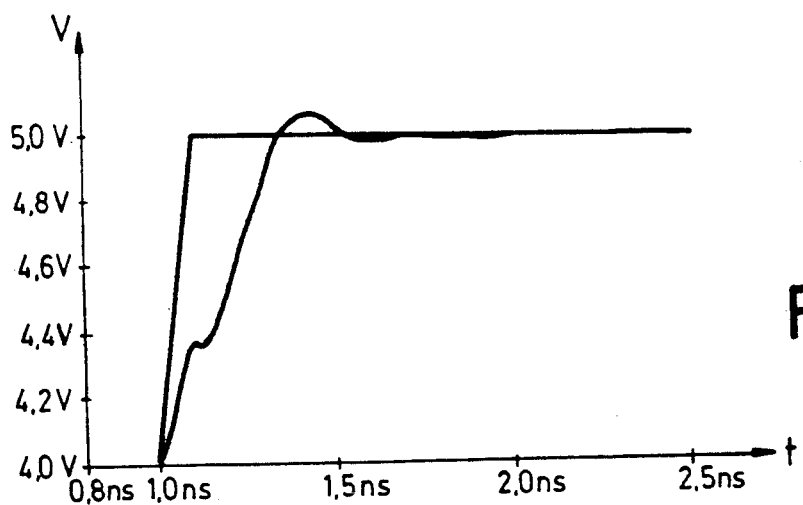

The slew-rate is shown in FIG. 8. With the technology and the bias values indicated here above, slew-rates greater than 1 KV/$\mu$s are obtained. BY increasing the zero-signal currents, with lower resistance values and minimum transistor geometries, if a lowering of performance characteristics is accepted in terms of noise, slew-rates of up to 4 KV/$\mu$s are obtained, and the performance characteristics of the passband are then slightly improved.

These slew-rates have been measured in the standard configuration of the non-inverter follower assembly.

The slew-rate values indicated here are those relating to the intrinsic structure of the amplifier. In the particular example of operation on a significant capacitive load (10 pF), the slew-rate is essentially limited to the discharging, by the bias current generator, of the class A additional output follower interposed after this stage.

Although there are known alternative approaches that can be used to increase this slew-rate under particular operating conditions, these approaches inevitably reduce the passband of the amplifier which then becomes smaller than one gigahertz.

Figure 9:
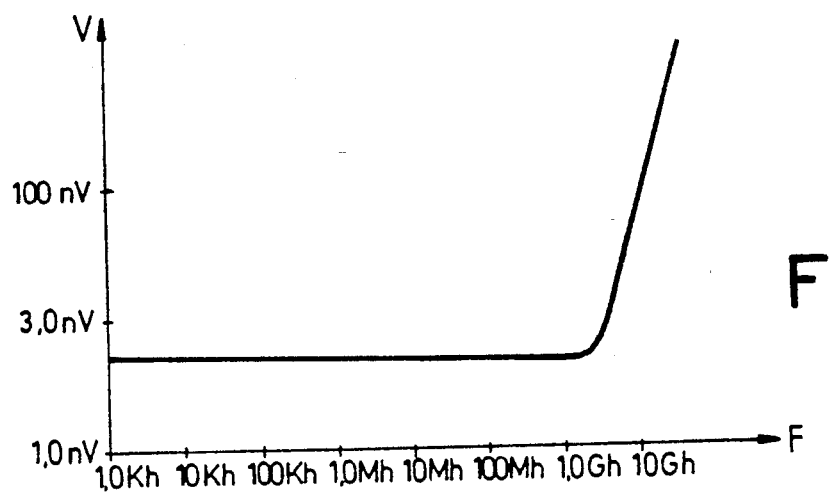

Finally, FIG. 9 shows the spectral density of input noise, in nV/√Hz, as a function of frequency. Under the conditions of bias indicated, this noise of the order of 2.7 nV/√Hz is almost flat up to the frequency of transition of the amplifier.

The differential amplifier according to the invention therefore has good dynamic characteristics and, simultaneously, high gain. With the bias values referred to, its open loop gain, in differential output mode, is 60 dB.

The chief limitation with respect to the value of the LF gain is the value of the Early voltage of the amplifier transistors of the input pair 1 and 2. A standard method of circumventing this difficulty consists in cascoding the assembly. This makes it possible to gain between 10 and 15 dB on the value of the loop gain. This is the type of assembly shown in FIG. 4.

The differential amplifier according to the invention is used in assemblies requiring both high gain and good dynamic performance characteristics in a wide passband: for example in an ultra-fast analog multiplexer or a sample-and-hold unit.

What is claimed is:

1. A high-gain differential amplifier comprising: two parallel channels, each parallel channel comprising:
   at least one semiconductor device;
   a load resistor connected to the at least one semiconductor device;
   a current generator for drawing current through the load resistor of each channel, the current generator being connected between a voltage source and a point common to the at least one semiconductor device and load resistor;
   wherein said current generators of the two parallel channels constitute a transconductance amplifier controlled by a differential voltage flowing through the load resistors of the two parallel channels.

2. The amplifier according to claim 1, wherein the semiconductor device of each channel is a transistor, having a base as an input of the high-gain differential amplifier and a collector connected to the load resistor and forming an output of the high-gain differential amplifier.

3. A high-gain differential amplifier comprising:
   first and second parallel channels, each parallel channel comprising:
      a current mirror circuit comprising first and second transistors;
      a load resistor connected to the current mirror circuit;
      a current generator for drawing current through the load resistor of each channel, the current generator being connected between a voltage source and a point common to the current mirror circuit and load resistor;
   wherein a first input of the high-gain differential amplifier is connected to an emitter of the first transistor of the current mirror circuit of the first channel and an emitter of the second transistor of the current mirror circuit of the second channel and a second input of the high-grain differential amplifier is connected to an emitter of the second transistor of the first current mirror circuit of the first channel and an emitter of the first transistor of the second current mirror circuit of the second channel.

4. A high-gain differential amplifier comprising:
   two parallel channels, each parallel channel comprising:
      at least one transistor;
      a first load resistor connected to the at least one transistor;
      a current generator for drawing current through the load resistor of each channel, the current generator comprising a follower transistor having a base connected to a first output point common to the at least one transistor and load resistor, and a current mirror circuit connected to an emitter of the follower transistor through a second resistor.

5. The amplifier according to claim 4, further comprising a second output in each current mirror circuit, said second output being formed between the emitter of the follower transistor and the second resistor for letting current into the emitter of the follower transistor.

6. The amplifier according to claim 4, further comprising a diode connected in series between the first load resistor and a voltage supply $V_{cc}$.

7. The amplifier according to claim 4, wherein the current mirror circuit comprises at least two transistors and at least two resistors connected to emitters of the at least two transistors for reducing a noise factor of the high-gain differential amplifier.

8. The amplifier according to claim 4, further comprising a voltage source connected to the current generators for adjusting static and/or dynamic parameters of the current generators independently.

* * * * *